US012712519B2

(12) United States Patent
Goto et al.

(10) Patent No.: US 12,712,519 B2
(45) Date of Patent: Aug. 18, 2026

(54) PACKAGED ACOUSTIC WAVE DEVICES WITH MULTILAYER PIEZOELECTRIC SUBSTRATE

(71) Applicant: SKYWORKS SOLUTIONS, INC., Irvine, CA (US)

(72) Inventors: Rei Goto, Osaka (JP); Hironori Fukuhara, Ibaraki (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 714 days.

(21) Appl. No.: 18/131,913

(22) Filed: Apr. 7, 2023

(65) Prior Publication Data

US 2023/0336145 A1 Oct. 19, 2023

Related U.S. Application Data

(60) Provisional application No. 63/362,906, filed on Apr. 13, 2022.

(51) Int. Cl.

| | |
|---|---|
| *H03H 9/02* | (2006.01) |
| *H03H 3/08* | (2006.01) |
| *H03H 9/10* | (2006.01) |

(52) U.S. Cl.

CPC .......... *H03H 9/02834* (2013.01); *H03H 3/08* (2013.01); *H03H 9/02897* (2013.01); *H03H 9/1092* (2013.01)

(58) Field of Classification Search

CPC .. H03H 9/02834; H03H 3/08; H03H 9/02897; H03H 9/1092; H03H 9/02102; H03H 9/02228

See application file for complete search history.

(56) References Cited

U.S. PATENT DOCUMENTS

| | | | | |
|---|---|---|---|---|
| 5,646,584 | A | 7/1997 | Kondratyev et al. | |
| 7,230,512 | B1 | 6/2007 | Carpenter et al. | |
| 9,438,201 | B2 | 9/2016 | Hori et al. | |
| 12,519,451 | B2 * | 1/2026 | Huang | H03H 9/02834 |
| 2014/0339957 | A1 | 11/2014 | Tajima et al. | |
| 2017/0063332 | A1 | 3/2017 | Gilbert et al. | |
| 2017/0214386 | A1 | 7/2017 | Kido | |
| 2017/0222618 | A1 | 8/2017 | Inoue et al. | |
| 2017/0250669 | A1 | 8/2017 | Kuroyanagi et al. | |
| 2017/0272051 | A1 | 9/2017 | Kurihara et al. | |
| 2017/0273183 | A1 | 9/2017 | Kawasaki et al. | |

(Continued)

*Primary Examiner* — Pedro J Cuevas

(74) *Attorney, Agent, or Firm* — Lando & Anastasi, LLP

(57) ABSTRACT

Disclosed is a packaged acoustic wave component and a method for making a packaged acoustic wave component. The packaged acoustic wave component comprises a substrate, a dielectric layer disposed over the substrate, a piezoelectric structure disposed over the dielectric layer, an electrode structure disposed over the piezoelectric structure, a polymer structure including a polymer structure wall portion and a polymer structure roof portion configured to form a cavity over the electrode structure, a metal structure disposed over the polymer structure, and a buffer coating disposed over the metal structure. The polymer structure includes a polymer structure lateral portion sandwiched between the substrate, the dielectric layer, or the piezoelectric structure on one side, and both the metal structure and the buffer coating on the other side.

20 Claims, 9 Drawing Sheets

(56) References Cited

U.S. PATENT DOCUMENTS

| | | | |
|---|---|---|---|
| 2017/0288629 | A1 | 10/2017 | Bhattacharjee et al. |
| 2017/0359048 | A1 | 12/2017 | Yasuda |
| 2018/0013404 | A1 | 1/2018 | Kawasaki et al. |
| 2018/0316329 | A1 | 11/2018 | Guenard et al. |
| 2018/0367119 | A1 | 12/2018 | Lee |
| 2019/0288661 | A1 | 9/2019 | Akiyama et al. |
| 2020/0067482 | A1 | 2/2020 | Maki et al. |
| 2020/0366270 | A1 | 11/2020 | Matsuoka |
| 2021/0058057 | A1 | 2/2021 | Goto et al. |
| 2021/0159886 | A1 | 5/2021 | Goto et al. |
| 2022/0014175 | A1 | 1/2022 | Nagatomo et al. |
| 2022/0077840 | A1 | 3/2022 | Caron |
| 2023/0026465 | A1* | 1/2023 | Huang ............... H03H 9/02834 |
| 2023/0403939 | A1* | 12/2023 | Goto .................... H03H 9/1071 |
| 2024/0007079 | A1* | 1/2024 | Goto ........................ H03H 3/08 |

* cited by examiner

PACKAGED ACOUSTIC WAVE DEVICES WITH MULTILAYER PIEZOELECTRIC SUBSTRATE

CROSS-REFERENCE TO RELATED APPLICATIONS

This application claims priority under 35 U.S.C. § 119(e) to U.S. Provisional Patent Application Ser. No. 63/362,906, titled "PACKAGED ACOUSTIC WAVE DEVICES WITH MULTILAYER PIEZOELECTRIC SUBSTRATE," filed Apr. 13, 2022, the entire content of which is incorporated herein by reference in its entirety for all purposes.

BACKGROUND

Technical Field

Embodiments of this disclosure relate to acoustic wave devices, in particular to packaged acoustic wave components, which may also be designated as acoustic wave component packages.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed.

The packaging process for multilayer piezoelectric substrate packages with an acoustic wave device, so as to produce a packaged acoustic wave component, can apply stresses to the piezoelectric layer (e.g., during heat cycle testing) that can result in reliability issues including cracking of the piezoelectric layer.

SUMMARY

Accordingly, there is a need for a packaged acoustic wave component, in particular a surface acoustic wave (e.g., SAW or temperature compensated surface acoustic wave (TC-SAW)) package with improved reliability that can withstand stresses (e.g., from heat cycle testing) during the packaging process.

In accordance with one aspect of this disclosure, a packaged acoustic wave component comprises a substrate, a dielectric layer disposed over the substrate, a piezoelectric structure disposed over the dielectric layer, an electrode structure disposed over the piezoelectric structure, a polymer structure including a polymer structure wall portion and a polymer structure roof portion configured to form a cavity over the electrode structure, a metal structure disposed over the polymer structure, and a buffer coating disposed over the metal structure, the polymer structure having a polymer structure lateral portion sandwiched between the substrate, the dielectric layer, or the piezoelectric structure on one side, and both directly the metal structure and directly the buffer coating on the other side.

In accordance with another aspect of this disclosure, a method of making a packaged acoustic wave component comprises forming an acoustic wave device including forming or providing a substrate, forming or providing a piezoelectric structure over at least a portion of the substrate, forming or providing an electrode structure disposed over the piezoelectric structure, providing a polymer structure lateral portion over the substrate or over the piezoelectric layer, forming or providing a polymer structure including a polymer structure wall portion and a polymer structure roof portion configured to form a cavity over the electrode structure, forming or providing a metal structure disposed over the polymer structure, and forming a buffer coating disposed over the metal structure, the polymer structure having a polymer structure lateral portion sandwiched between the substrate, the dielectric layer, or the piezoelectric structure on one side, and both directly the metal structure as well as directly the buffer coating on the other side.

BRIEF DESCRIPTION OF THE DRAWINGS

Embodiments of this disclosure will now be described, by way of non-limiting example, with reference to the accompanying drawings.

DETAILED DESCRIPTION

Figures 1, 2:
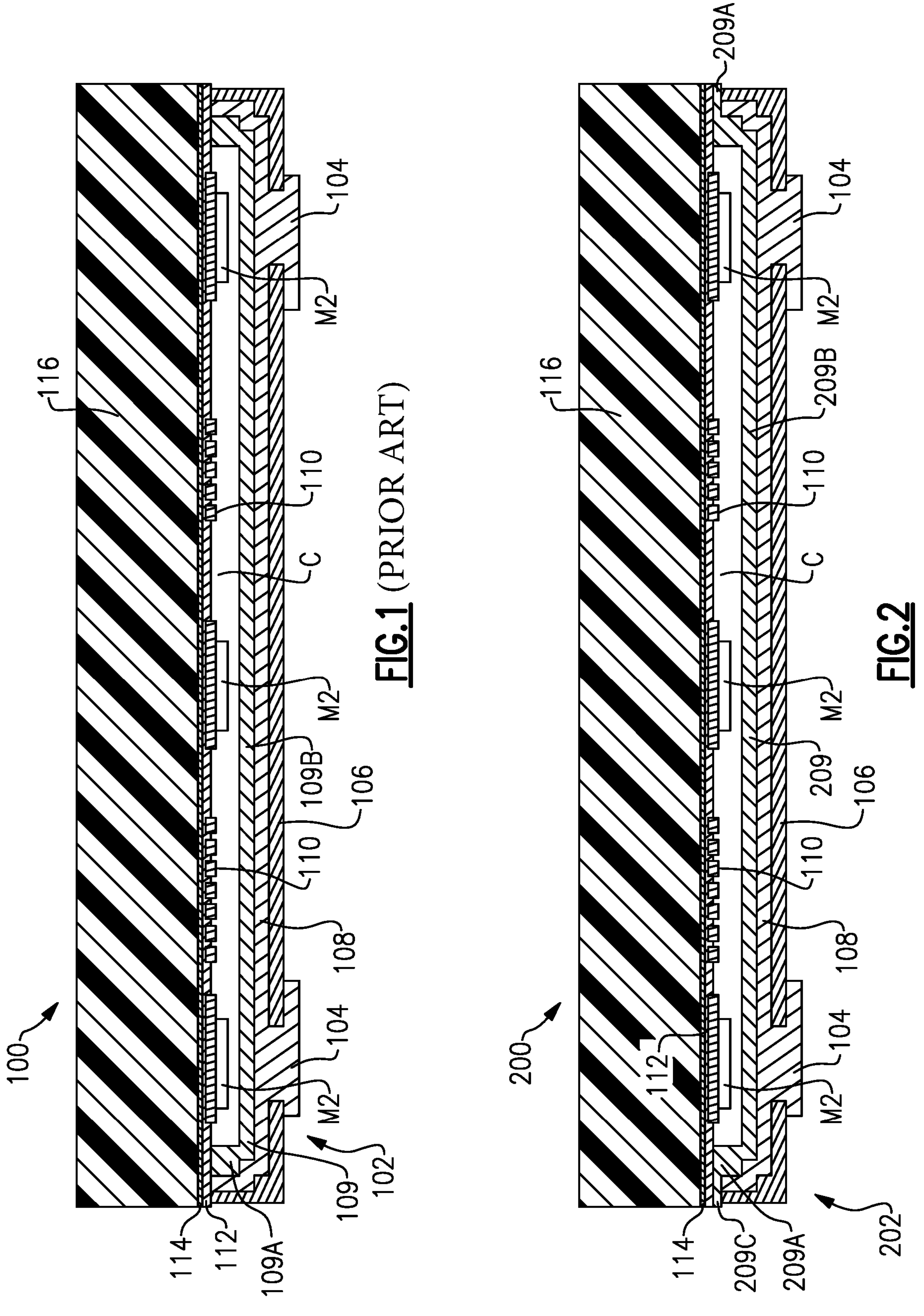
FIG. 1 illustrates a schematic cross-sectional side view of a conventional packaged acoustic wave component.
FIG. 2 illustrates a schematic cross-sectional side view of a packaged acoustic wave component.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of implementations, such as in an RF front end of a mobile phone. An acoustic wave filter can be implemented with surface acoustic wave (SAW) devices. SAW devices include SAW resonators, SAW delay lines, and multi-mode SAW (MMS) filters (e.g., double mode SAW (DMS) filters). Any features of the SAW resonators and/or devices discussed herein can be implemented in any suitable SAW device.

In general, high quality factor (Q), large effective electromechanical coupling coefficient ($k^2$), high frequency ability, and spurious free response can be significant aspects for acoustic wave elements to enable low-loss filters, delay lines, stable oscillators, and sensitive sensors.

Multi-layer piezoelectric substrate (MPS) SAW resonators can thermally insulate an interdigital transducer electrode and a piezoelectric layer. By reducing dissipative thermal impedance of the SAW device the ruggedness and power handling can be improved.

Some MPS SAW resonators have achieved a high Q by confining energy and good thermal dissipation using a silicon (Si) support layer. However, such approaches have encountered technical challenges related to undesirable higher frequency spurious responses.

Some other MPS SAW resonators have achieved a high Q by confining energy and have also reduced higher frequency spurious responses. However, such approaches have exhibited relatively low thermal heat dissipation.

Aspects of the present disclosure relate to SAW resonators that include a support substrate or layer (e.g., a single crystal supporting substrate), a functional layer (e.g., a dielectric layer) over the support substrate or layer, a piezoelectric layer (e.g., a lithium niobate (LN or $LiNbO_3$) layer or a lithium tantalate (LT or $LiTaO_3$) layer) over the functional layer, and an interdigital transducer (IDT) electrode over the piezoelectric layer. Such SAW resonators can also include a temperature compensation layer (e.g., a silicon dioxide ($SiO_2$) layer) over the IDT electrode in certain embodiments. The SAW resonators can also include an adhesion layer disposed between the support substrate and the functional layer and/or an adhesion layer between the functional layer and the piezoelectric layer in certain embodiments.

SAW resonators with the functional layer and the support layer or substrate can beneficially provide a relatively high effective electromechanical coupling coefficient ($k^2$), a relatively high quality factor (Q), a relatively high power durability and thermal dissipation, and reduced high frequency spurious responses. The high electromechanical coupling coefficient ($k^2$) can be beneficial for relatively wide bandwidth filters. The high quality factor (Q) can beneficially lead to a relatively low insertion loss. The reduced high frequency spurious response may make the SAW resonators compatible with multiplexing with higher frequency bands.

In an embodiment, an MPS SAW resonator includes a piezoelectric layer over a functional layer over a silicon support substrate or layer. The silicon support substrate can reduce thermal impedance of the MPS SAW resonator. The functional layer can be a single crystal layer arranged to confine acoustic energy and reduce a higher frequency spurious response. The piezoelectric layer, the functional layer, and the silicon support substrate can all be single crystal layers.

Embodiments of MPS SAW resonators (e.g., packages) will now be discussed. Any suitable principles and advantages of these MPS SAW resonators can be implemented together with each other in an MPS SAW resonator and/or in an acoustic wave filter. MPS SAW resonators (e.g., packages) disclosed herein can have lower loss than certain bulk acoustic wave devices.

FIG. 1 illustrates a packaged acoustic wave component 100 (e.g., a multi-layer piezoelectric substrate (MPS) package or structure) according to the prior art. The component 100 has a substrate 116, an additional (e.g., functional, dielectric) structure or layer 114 disposed over (e.g., bonded to) the substrate 116, and a piezoelectric structure or layer 112 disposed over (e.g., bonded to) the functional layer 114. The functional layer 114 may, for example, comprise silicon ducts to improve thermal properties and/or the temperature coefficient of frequency (TCF) of the component 100. An electrode structure, specifically an interdigital transducer (IDT) electrode 110, is disposed on (e.g., connected to) the piezoelectric layer 112 as part of a first metal layer. The dielectric layer 114 can also be designated as a functional layer as it may provide one or more functions. On the first metal layer, a second metal layer M2 can be provided which usually has a greater thickness than the first metal layer to reduce its electrical resistance. The second metal layer M2 may be used to form signal lines connecting the IDT electrode 110 to contact terminals of the packaged acoustic wave component 100, e.g., to solder connections 104. In some embodiments, the two solder connections may be electrically coupled by the second metal layer M2 and used to provide redundant signal or ground connections.

With continued reference to FIG. 1, a thermally conductive structure or package 102 is connected to the substrate 116 via at least piezoelectric layer 112 and functional (specifically, dielectric) layer 114. The thermally conductive structure or package 102 includes a metal structure 108 and a polymer structure 109 disposed over at least a portion of the metal structure 108. The polymer structure 109 may comprise, or consist of, a polyimide material and/or a polybenzoxazole (PBO) material. In addition, a structure containing a filler such as silicon dioxide, $SiO_2$, may be applied to the polymer structure 109.

The metal structure 108 and the polymer structure 109 are shaped so that a cavity C (e.g., open or hollow cavity, air cavity) exists between at least a portion of the polymer structure 109 and at least a portion of the piezoelectric layer 112. The cavity C houses (or encloses) the IDT 110 and may house (or enclose) the functional layer 114 and/or the piezoelectric layer 112 partially or completely. The polymer structure 109 may thus comprise a polymer structure wall portion 109A (forming the walls of the cavity C) and a polymer structure roof portion 109B (forming the roof of the cavity C). The metal structure 108 can be made of copper (Cu). A buffer coating (or dielectric overcoat) 106) is disposed over at least a portion of the metal structure 108. The buffer coating 106 may be made of any suitable polymer which may be chosen such as to provide a desired hardness. One or more solder connections 104 are disposed on the metal structure 108 so that the metal structure 108 is between the solder connections 104 and the piezoelectric layer 112. The metal structure 108 connects to the piezoelectric layer 112 via—not depicted—signal line(s) (e.g., so at least a portion of the piezoelectric layer 112 and dielectric layer 114 are disposed between the signal line(s) and the substrate 116).

During the packaging process the piezoelectric layer 112 and/or the dielectric layer 114 can be subjected to high stresses, for example, due to the different thermal expansion performances of the substrate 116 and the thermally conductive structure or package 102 (e.g., during a heat cycle test), which are transferred to the piezoelectric layer 112 by the metal structure 108 via the signal line(s). Such high stresses can result in damage (e.g., deformation and/or cracks) to the piezoelectric layer 112 and/or dielectric layer 114. Aspects and embodiments disclosed herein mitigate this problem.

FIG. 2 shows a packaged acoustic wave component 200 (e.g., a multi-layer piezoelectric substrate (MPS) package or structure) according to an embodiment. The packaged acoustic wave component 200 is similar to the packaged acoustic wave component 100 of FIG. 1. Thus, reference numerals used to designate the various components of the packaged acoustic wave component 200 are identical to those used for identifying the corresponding components of the packaged acoustic wave component 100 in FIG. 1. Therefore, the structure and description for the various features and components of the packaged acoustic wave component 100 in FIG. 1 are understood to also apply to the corresponding features of the packaged acoustic wave component 200 in FIGS. 2-4, except as described below or as shown differently in the figures.

The substrate 116 of the packaged acoustic wave component 200 can include (e.g., be made of or consist of) crystalline silicon (Si). In another example, the substrate 116 can be made of poly-silicon. In another example, the substrate 116 can be made of amorphous silicon. In another example, the substrate 116 can be made of silicon nitride (SiN). In another example, the substrate 116 can be made of sapphire. In another example, the substrate 116 can be made of quartz. In another example, the substrate 116 can be made of aluminum nitride (AlN). In another example, the substrate 116 can be made of polycrystalline ceramic (e.g., $Mg_2O_4$). In another example, the substrate 116 can be made of diamond. In other examples, the substrate 116 can be made of other suitable high impedance materials. An acoustic impedance of the substrate 116 can be higher than an acoustic impedance of the piezoelectric structure or layer 112 of the packaged acoustic wave component 200.

The functional (e.g., temperature compensation, dielectric) structure or layer 114 of the packaged acoustic wave component 200 can have a lower acoustic impedance than the substrate 116. The functional structure or layer 114 can increase adhesion between the substrate 116 and the piezoelectric structure or layer 112 of the component 200 (e.g., multi-layer piezoelectric substrate (MPS) package or structure). Alternatively or additionally, the functional structure or layer 114 can increase the heat dissipation of the component 200. The functional structure or layer 114 can be made of silicon dioxide ($SiO_2$). In some implementations, the functional structure or layer is excluded from the component or package 200 (e.g., the piezoelectric layer 112 is disposed on, adjacent to, or in contact with the substrate 116).

In one implementation, the piezoelectric layer 112 can be made of lithium niobate (LN or $LiNbO_3$). In another implementation, the piezoelectric layer 112 can be made of lithium tantalate (LT or $LiTaO_3$). Though not shown, one or more resonators (e.g., including an interdigital transducer (IDT) electrode 110, for example, between two reflectors) can be disposed on (e.g., attached or mounted to) the piezoelectric layer 112.

The inventors have noticed that the piezoelectric layer 112 is susceptible to being damaged in a packaging process, i.e., in a process of providing a (preferably thermally conductive) package 202 over the piezoelectric layer 112 including the IDT electrodes 110. The inventors have also found a solution to this problem as illustrated in the embodiment shown in FIG. 2. In the embodiment illustrated in FIG. 2 the polymer structure 209 comprises, apart from the polymer structure wall portion 209A and the polymer structure roof portion 209B (analog to the polymer structure wall portion 109A and the polymer structure roof portion 109B of FIG. 1), a polymer structure lateral portion 209C sandwiched between the piezoelectric layer 112 on one side, and the metal structure 108 and the buffer coating 106 on the other side. The polymer structure lateral portion 209C acts as a stress buffer between the package 202 and the piezoelectric layer 112 especially during the attaching, or forming, of the package 202 on the piezoelectric layer 112. Thermal stress on the piezoelectric layer 112 during packaging can be substantially reduced in this way.

Figures 5, 6, 7:
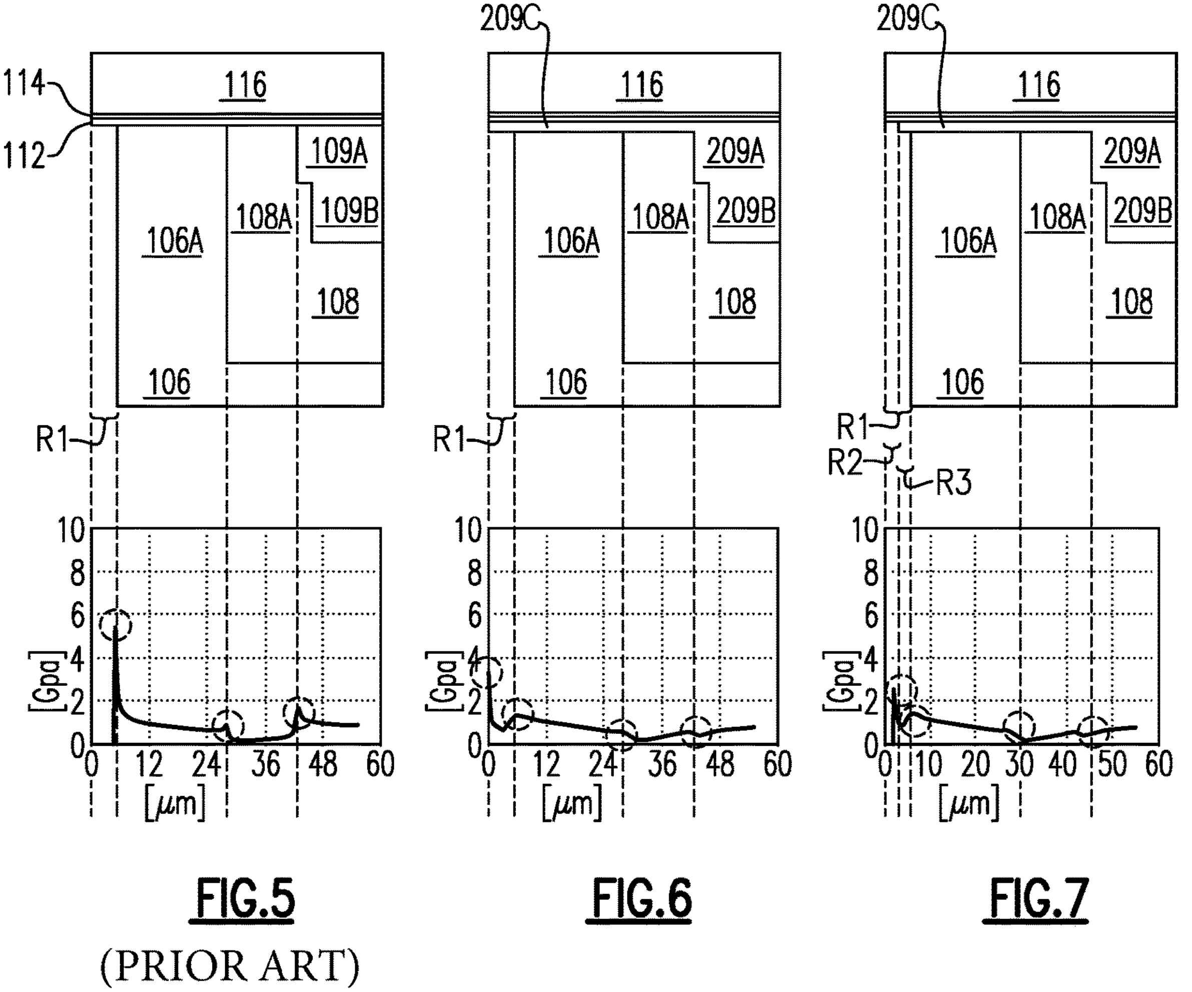
FIG. 5 illustrates a schematic cross-sectional side view of a detail of a conventional packaged acoustic wave component.
FIG. 6 illustrates a schematic cross-sectional side view of a detail of a packaged acoustic wave component.
FIG. 7 illustrates a schematic cross-sectional side view of a detail of a packaged acoustic wave component.

Specifically, the metal structure 108 comprises a metal structure wall portion 108A (see FIGS. 6 and 7), and the buffer coating 106 comprises a buffer coating wall portion 106A (see FIGS. 6 and 7 as well). The metal structure wall portion 108A laterally surrounds and encloses the polymer wall portion 209A and the buffer coating wall portion 106A in turn laterally surrounds and encloses the metal structure wall portion 108A. The polymer structure lateral portion 209C extends from the polymer wall portion 209A towards the outer edge of the packaged acoustic wave component 200, maintaining contact with the piezoelectric layer 112 on one side, and the metal structure wall portion 108A and the buffer coating wall portion 106A on the other side. Thermal and other stress caused or exerted by the packaging on the piezoelectric layer 112 is therefore advantageously buffered by the polymer structure lateral portion 209C. In some variants, the polymer structure lateral portion 209C is in contact not only with the functional layer 112 but with the piezoelectric layer 114 and/or the substrate 116 (see, e.g., FIG. 4). The polymer structure 209 may comprise, or consist of, a polyimide, for example poly-oxydiphenylene-pyromellitimide ("Kapton").

Figures 3, 4:
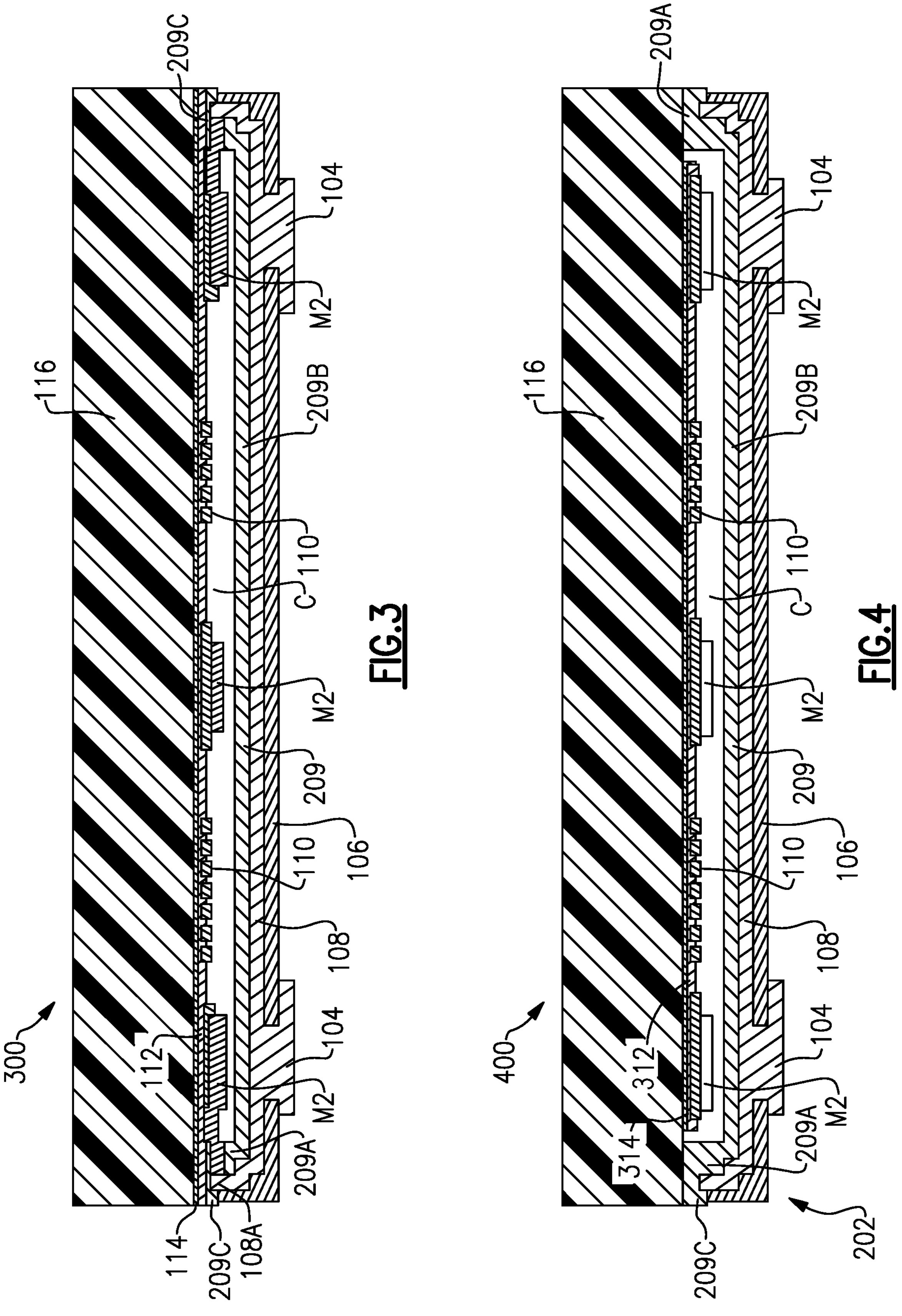
FIG. 3 illustrates a schematic cross-sectional side view of a packaged acoustic wave component.
FIG. 4 illustrates a schematic cross-sectional side view of a packaged acoustic wave component.

FIG. 3 shows a packaged acoustic wave component 300 (e.g., a multi-layer piezoelectric substrate (MPS) package or structure) according to an embodiment. The packaged acoustic wave component 300 is identical to the packaged acoustic wave component 200 of FIG. 2 apart from the difference that in the packaged acoustic wave component 300 the second metal layer M2 is formed such that it contacts the metal structure wall portion 108A to transmit signals. As shown in FIG. 3, because the second metal layer M2 is advantageously deposited as a layer, it may be arranged at different distances from the substrate 116 depending on how many, how thick, and which elements or layers are present at each location when the second metal layer M2 is deposited. The second metal layer M2 may thus take on a stepped appearance. To provide the buffering effect, the polymer structure lateral portion 209C is also arranged between a portion of the second metal layer M2 and the piezoelectric layer 112. Since it is sufficient when only a small part of the second metal layer M2 contacts the metal structure wall portion 108A, FIG. 2 and FIG. 3 may be seen as two different cross-sections of the same embodiment of a packaged acoustic wave component 200, 300, wherein FIG. 3 shows a cross-section that includes the portion of the second metal layer M2 contacting the metal structure wall portion 108A, and wherein FIG. 2 shows a cross-section that does not include said portion.

FIG. 4 shows a packaged acoustic wave component 400 (e.g., a multi-layer piezoelectric substrate (MPS) package or structure) according to an embodiment. The packaged acoustic wave component 400 is a variant of the packaged acoustic wave component 200 and differs from it in that a piezoelectric layer 312 is provided instead of the piezoelectric layer 112, and that a functional layer 314 is provided instead of the functional layer 114. In this embodiment, the piezoelectric layer 312 (and optionally also the functional layer 314) are recessed with respect to the edge of the substrate 116. Thus, a gap is present between the piezoelectric layer 312 and the functional layer 314 on one side, and the polymer structure 209 on the other side. In this gap, the substrate 116 may be directly exposed to the cavity C. The gap may be a gap zone surrounding the piezoelectric layer 312 and the functional layer 314 completely in two dimensions on the surface of the substrate 116. The polymer structure 209 in this embodiment therefore does not come into contact with either the piezoelectric layer 312 or the functional layer 314. Instead, it is directly (in contact) sandwiched between the substrate 116 on one side, and the metal structure wall portion 108A and the buffer coating wall portion 106A on the other side. This further reduces the stress on the piezoelectric layer 312, in particular, during packaging.

FIGS. 5 through 7 illustrate in their respective top portion schematic cross-sectional side views of packaged acoustic wave components according to several variants, and in their respective bottom portion graphs indicating a stress density (in GPa) as a function of distance (in micrometers) along the packaged acoustic wave component shown in the corresponding top portion. For the graphs, copper has been supposed as the material of the entire metal structure 108 and polyimide has been supposed as the material of the entire polymer structure 209.

FIG. 5 shows the situation for the prior art packaged acoustic wave component 100 shown in FIG. 1 where the buffer coating 106 (specifically, its buffer coating wall portion 106A) and the metal structure 108 (specifically, its metal structure wall portion 108A) directly touch the functional layer 112, for the sake of comparison. FIGS. 6 and 7 illustrate in their respective top sections variants for the outer lateral edges of the packaged acoustic wave components 200-400.

FIG. 5 shows the prior art variant of packaged acoustic wave component 100 in which the polymer structure wall portion 109A, the metal structure wall portion 108A, and the buffer coating wall portion 106A are arranged, in this order from inside to outside, on the piezoelectric layer 112. The buffer coating wall portion 106A as the outermost wall portion is recessed by a first distance R1 from coextensive outer lateral edges of the substrate 116, functional layer 114, and piezoelectric layer 112. As a result, as shown in the bottom section of FIG. 5, there is a stress spike right where the outer edge (or flank) of the buffer coating wall portion 106A begins, i.e., at its onset.

By contrast, FIG. 6 shows the situation for the packaged acoustic wave component 200 of FIG. 2, wherein the polymer structure lateral portion 209C is interposed between the metal structure wall portion 108A and the buffer coating wall portion 106A on one side and the piezoelectric layer 112 on the other side. In this variant, the polymer structure lateral portion 209C is arranged flush with the outer lateral edges of the substrate 116, functional layer 114, and piezoelectric layer 112, whereas the buffer coating wall portion 106A is recessed from said outer lateral edges by the first distance R1. As is evident from the graph in the bottom section of FIG. 6, this reduces the initial stress spike, and furthermore significantly reduces the stress at the onset of the buffer coating wall portion 106A.

FIG. 7 shows another variant that may be employed with any of the embodiments disclosed herein, e.g., any of the packaged acoustic wave components 200, 300, or 400. In the embodiment of FIG. 7, a double-step recess layout is provided. The substrate 116, the functional layer 114, and the piezoelectric layer 112 are formed flush with each other, forming coextensive outer lateral edges as shown in FIG. 5 and FIG. 6. Then, moving from outside to inside, recessed from said outer lateral edges by a second distance R2, the polymer structure lateral portion 209C directly in contact with the piezoelectric layer 112 sets on. After another, third distance R3, the buffer coating wall portion 106A in direct contact with the polymer structure lateral portion 209C sets on. For the sake of comparison, R2+R3 have been chosen to be equal to R1. The graph in the bottom section of FIG. 7 clearly shows how the initial stress as well as the overall integral under the stress curve is further lowered by this design. Although described with respect to the piezoelectric layer 112, the same design as in FIG. 6 or 7 may be applied when the polymer structure lateral portion 209C directly contacts the functional layer 114 and/or the substrate 116.

Figure 8:
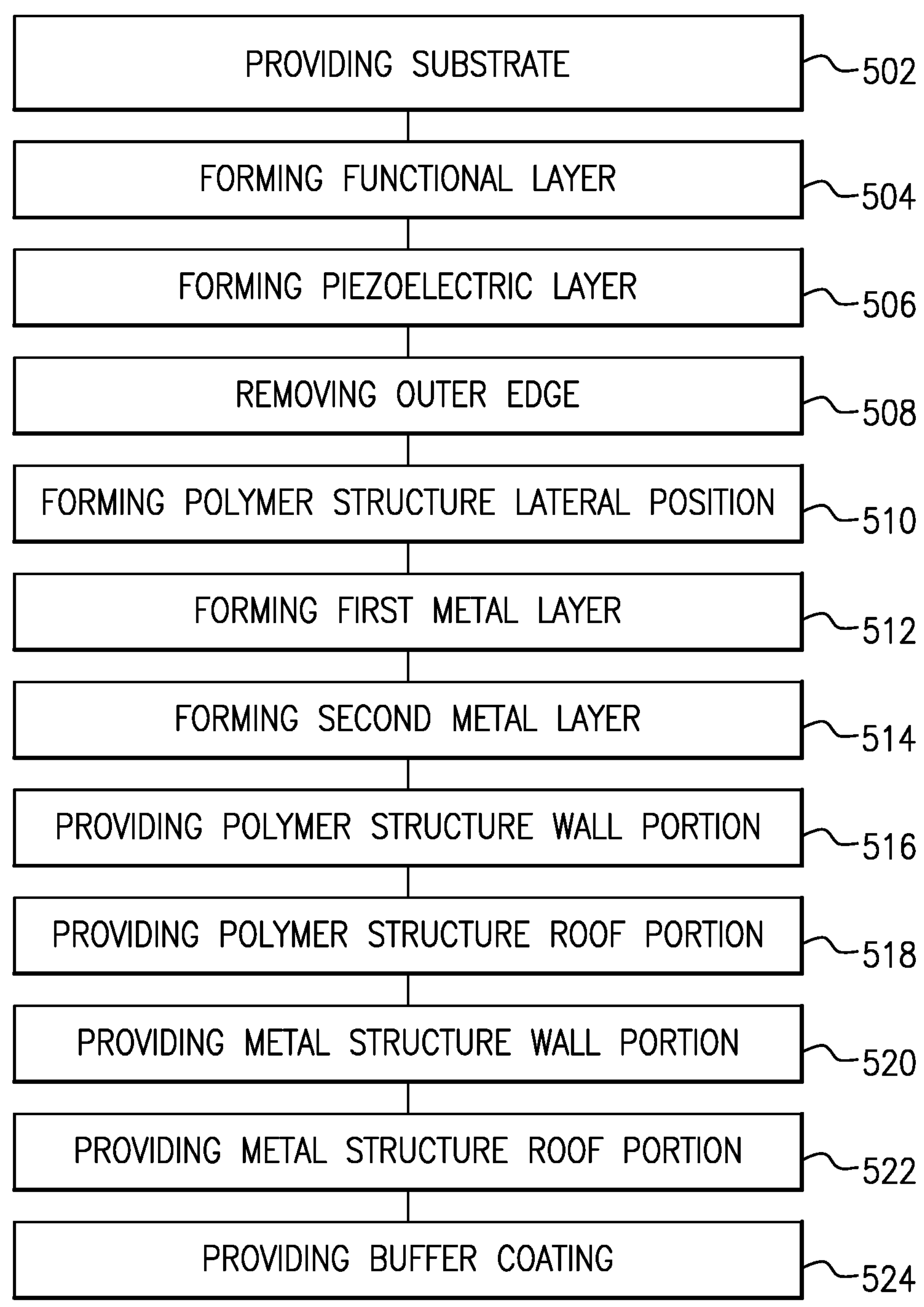
FIG. 8 illustrates a method of making the multi-layer piezoelectric substrate (MPS) package structure of FIGS. 2-4 and 6-7.

FIG. 8 illustrates a method 500 of making a packaged acoustic wave component (e.g., a multi-layer piezoelectric substrate (MPS) package or structure), such as the components 200-400 in FIGS. 2 through 4. The method 500 includes the step 502 of forming or providing a substrate (e.g., substrate 116). The method 500 includes the step 504 of forming or providing a functional (e.g., temperature compensation, dielectric) structure or layer (such as the functional layer 114) over the substrate. The method 500 includes the step 506 of forming or providing a piezoelectric structure or layer (such as the piezoelectric layer 112) over the functional layer. The method 500 may include an optional step 508 of removing (e.g., etching) an outer edge or boundary of the piezoelectric layer 112 and functional layer 114, for example, for making the packaged acoustic wave component 400 of FIG. 4. The method 500 may include a step 510 of forming the polymer structure lateral portion 209C on the piezoelectric layer 112, 312, a step 512 of forming the first metal layer including the IDT electrode 110, and a step 514 of forming the second metal layer M2. In step 514, in two or more locations the second metal layer M2 may be provided on top of the polymer structure lateral portion 209C as shown in FIG. 3 such as to provide an electrical connection to the IDT electrodes 110 through the polymer structure wall portion 209A. Apart from these two or more locations, the polymer structure lateral portion 209C may be kept free from the second metal layer M2. In further steps, the remainder of the thermally conductive structure 202 in any of the described variants may be provided and attached to the intermediate product comprising the substrate 116. The remainder of the thermally conductive structure 202 may be manufactured as a whole and then attached.

Alternatively, the following steps may be performed: In a step 516, the polymer structure wall portion 209A is provided (in particular, formed) over the polymer structure lateral portion 209C and, if applicable, over parts of the second metal layer M2 that have been formed over the polymer structure lateral portion 209C. In step 518, the polymer structure roof portion 209B is provided (in particular, formed) over the polymer structure wall portion 209A to form the cavity C. In step 520, the metal structure wall portion 108A is provided (in particular, formed) such as to cover the polymer structure wall portion 209A and to contact the second metal layer M2 in the two or more locations where the second metal layer M2 tunnels through the polymer structure wall portion 209A. In this way, an electrically conductive connection is provided between the IDT electrodes 110 and the metal structure 108. In a further step 522, the remainder of the metal structure 108, in particular, a roof structure of the metal structure 108 is provided and, in a further step 524, the buffer coating 106 is provided, covering the polymer structure lateral portion 209C and the metal structure 108.

Since, as shown in FIG. 2, the polymer structure 209 is the only part of the thermally conductive structure that contacts the portion of the packaged acoustic wave component 200 comprising the substrate 116, it is also possible that the metal structure 108 and/or the buffer coating 106 are formed on the polymer structure 209 after the thermally conductive structure consisting of, or comprising, the polymer structure 209 has been attached in step 510.

In one implementation, a method of making a radio frequency module includes the steps above for method 500 in addition to forming or providing a package substrate and attaching additional circuitry and the packaged acoustic wave component to the package substrate.

Advantageously, the packaged acoustic wave component 200-400 reduces the mechanical stress to which the piezoelectric and/or dielectric layers are subjected (e.g., during heat cycle testing due to the different thermal expansion characteristics of the substrate and the metal structure attached to the substrate) and avoid cracks or breaks therein. This results in improved reliability and mechanical ruggedness of the packaged acoustic wave components 200-400, optionally with any of the variants of FIG. 6 or 7. Such temperature performance advantageously allows use of the packaged acoustic wave components 200-400 for high power applications (e.g., in a high power transmit filter). It also allows for a size reduction in the packaged acoustic wave component 200-400, as described above, optionally with any of the variants of FIG. 6 or 7.

An MPS acoustic wave resonator or device or die in a packaged acoustic wave component, including any suitable combination of features disclosed herein, can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more MPS acoustic wave resonators disclosed herein. FR1 can be from 410 MHz to 7.125 GHz, for example, as specified in a current 5G NR specification. In 5G applications, the thermal dissipation of the MPS acoustic wave resonators disclosed herein can be advantageous. For example, such thermal dissipation can be desirable in 5G applications with a higher time-division duplexing (TDD) duty cycle compared to fourth generation (4G) Long Term Evolution (LTE). One or more MPS acoustic wave resonators in accordance with any suitable principles and advantages disclosed herein can be included in a filter arranged to filter a radio frequency signal in a 4G LTE operating band and/or in a filter having a passband that includes a 4G LTE operating band and a 5G NR operating band.

Figures 9A, 9B:
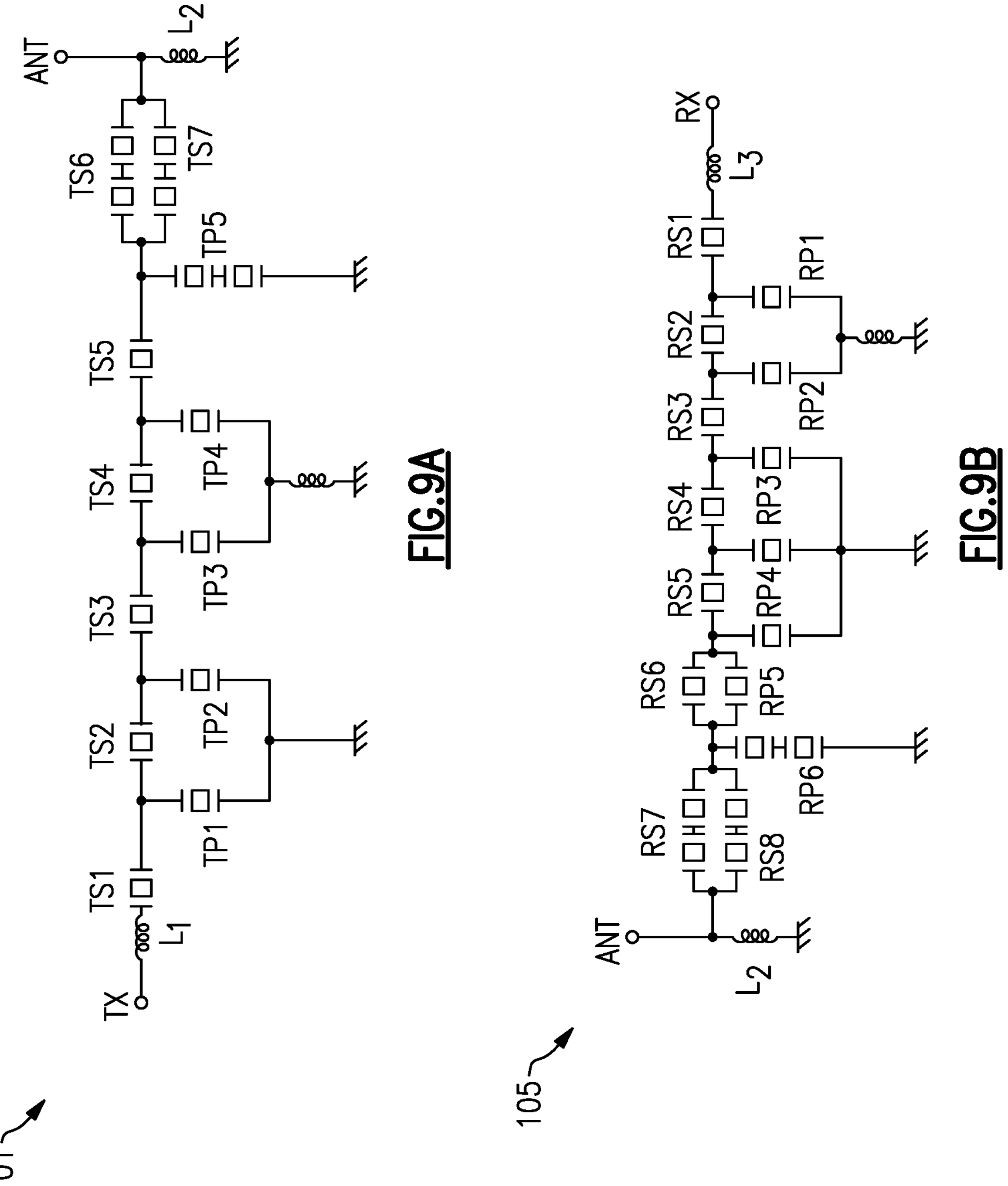
FIG. 9A is a schematic diagram of a transmit filter that includes a surface acoustic wave resonator according to an embodiment.
FIG. 9B is a schematic diagram of a receive filter that includes a surface acoustic wave resonator according to an embodiment.

FIG. 9A is a schematic diagram of an example transmit filter 101 that includes surface acoustic wave resonators according to an embodiment. The transmit filter 101 can be a band pass filter. The illustrated transmit filter 101 is arranged to filter a radio frequency signal received at a transmit port TX and provide a filtered output signal to an antenna port ANT. Some or all of the SAW resonators TS1 to TS7 and/or TP1 to TP5 can be a SAW resonator in accordance with any suitable principles and advantages disclosed herein. For instance, one or more of the SAW resonators of the transmit filter 101 can be part of one or more of the packaged acoustic wave components such as the packaged acoustic wave components 200-400 of FIGS. 2-4, optionally with any of the variants of FIG. 6 or 7. Any suitable number of series SAW resonators and shunt SAW resonators can be included in a transmit filter 101.

FIG. 9B is a schematic diagram of a receive filter 105 that includes surface acoustic wave resonators according to an embodiment. The receive filter 105 can be a band pass filter. The illustrated receive filter 105 is arranged to filter a radio frequency signal received at an antenna port ANT and provide a filtered output signal to a receive port RX. Some or all of the SAW resonators RS1 to RS8 and/or RP1 to RP6 can be SAW resonators included in a packaged acoustic wave component in accordance with any suitable principles and advantages disclosed herein. For instance, one or more of the SAW resonators of the receive filter 105 can be part of one or more of the packaged acoustic wave components 200-400, optionally with any of the variants of FIG. 6 or 7. Any suitable number of series SAW resonators and shunt SAW resonators can be included in a receive filter 105.

Although FIGS. 9A and 9B illustrate example ladder filter topologies, any suitable filter topology can include a SAW resonator in accordance with any suitable principles and advantages disclosed herein. Example filter topologies include a ladder topology, a lattice topology, a hybrid ladder and lattice topology, a multi-mode SAW filter, a multi-mode SAW filter combined with one or more other SAW resonators, and the like.

Figure 10:
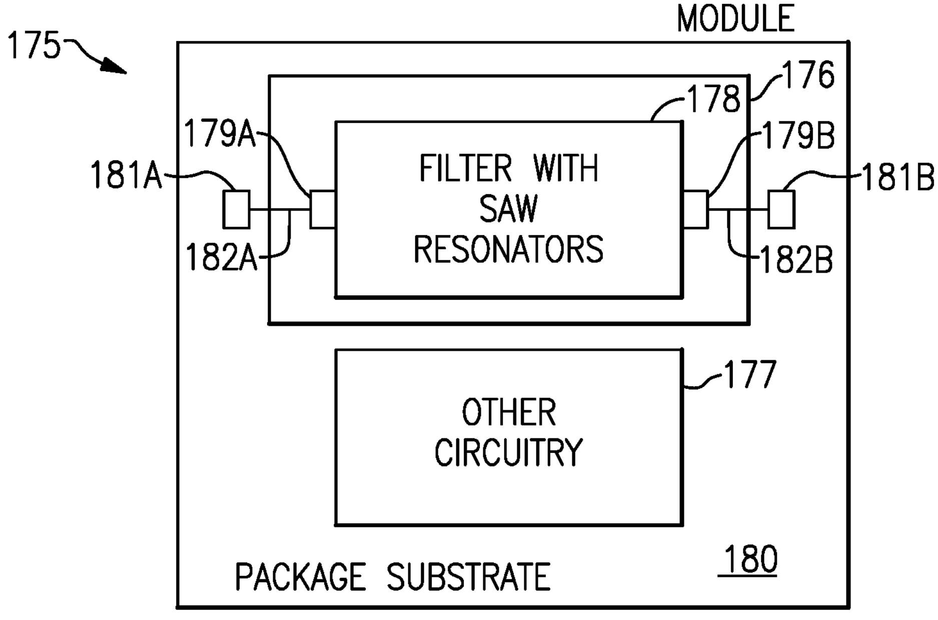
FIG. 10 is a schematic diagram of a radio frequency module that includes a surface acoustic wave resonator according to an embodiment.

FIG. 10 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW resonators with any suitable combination of features of the SAW resonators or packages disclosed herein. The SAW component 176 can include a SAW die that includes SAW resonators.

The SAW component 176 shown in FIG. 10 includes a filter 178 and terminals 179A and 179B. The filter 178 includes SAW resonators. One or more of the SAW resonators can be implemented in accordance with any suitable principles and advantages of the packaged acoustic wave components 200-400, optionally with any of the variants of FIG. 6 or 7. The terminals 179A and 178B can serve, for example, as an input contact and an output contact. The SAW component 176 and the other circuitry 177 are on the same packaging substrate 180 in FIG. 10. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 11:
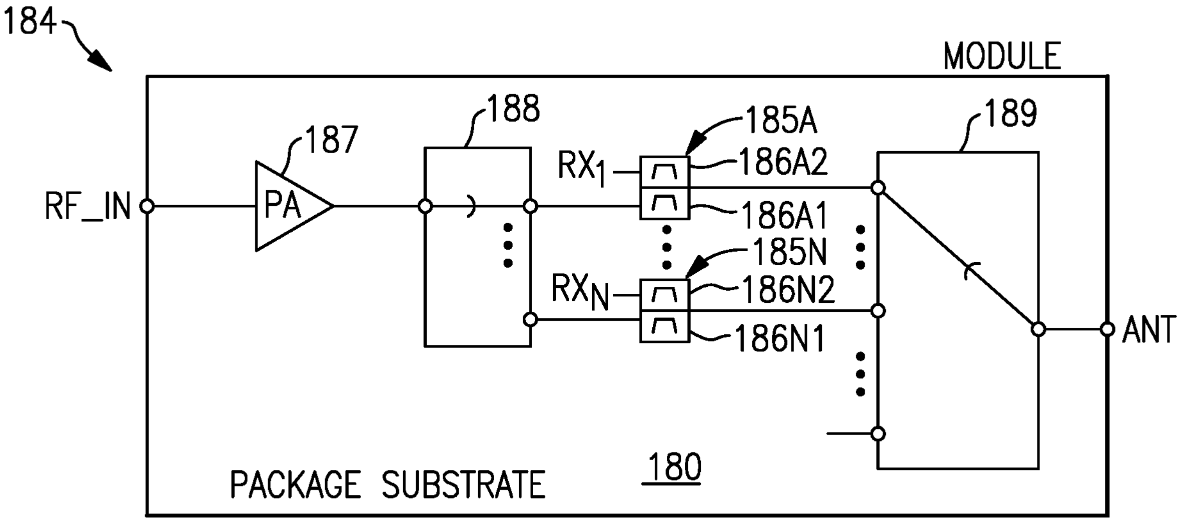
FIG. 11 is a schematic diagram of a radio frequency module that includes filters with surface acoustic wave resonators according to an embodiment.

FIG. 11 is a schematic diagram of a radio frequency module 184 that includes a surface acoustic wave resonator according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on the same packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW resonators or packages in accordance with any suitable principles and advantages disclosed herein. Similarly, one or more of the receive filters 186A2 to 186N2 can include one or more SAW resonators in accordance with any suitable principles and advantages disclosed herein. Although FIG. 11 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 12:
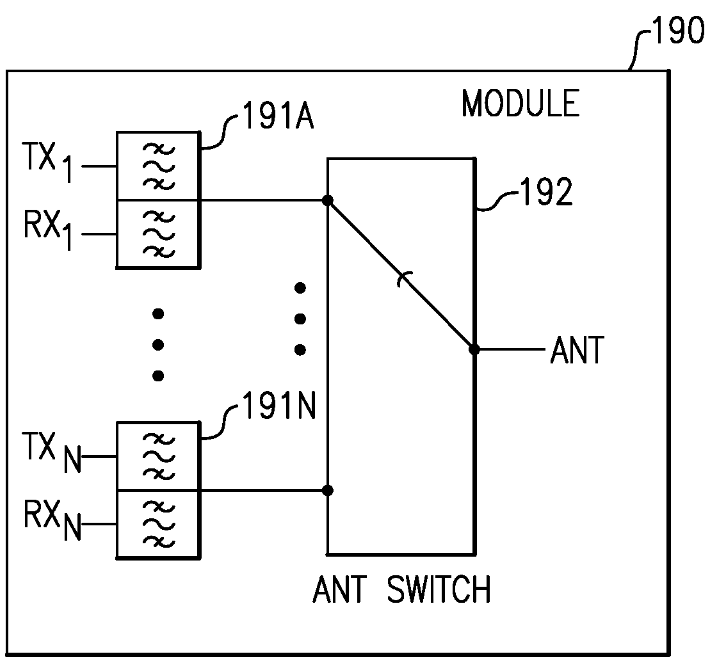
FIG. 12 is a schematic block diagram of a module that includes an antenna switch and duplexers that include a surface acoustic wave resonator according to an embodiment.

FIG. 12 is a schematic block diagram of a module 190 that includes duplexers 191A to 191N and an antenna switch 192. One or more filters of the duplexers 191A to 191N can include any suitable number of surface acoustic wave resonators or packages in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 13A:
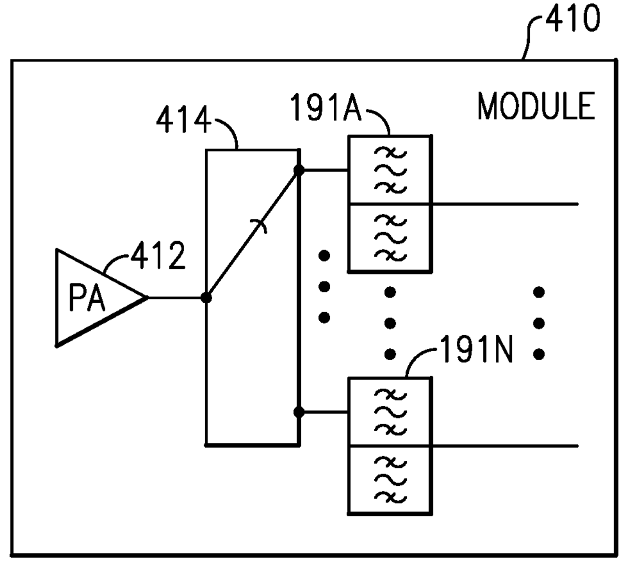
FIG. 13A is a schematic block diagram of a module that includes a power amplifier, a radio frequency switch, and duplexers that include a surface acoustic wave resonator according to an embodiment.

FIG. 13A is a schematic block diagram of a module 410 that includes a power amplifier 412, a radio frequency switch 414, and duplexers 191A to 191N in accordance with one or more embodiments. The power amplifier 412 can amplify a radio frequency signal. The radio frequency switch 414 can be a multi-throw radio frequency switch. The radio frequency switch 414 can electrically couple an output of the power amplifier 412 to a selected transmit filter of the duplexers 191A to 191N. One or more filters of the duplexers 191A to 191N can include any suitable number of surface acoustic wave resonators or packages in accordance with any suitable principles and advantages discussed herein. Any suitable number of duplexers 191A to 191N can be implemented.

Figure 13B:
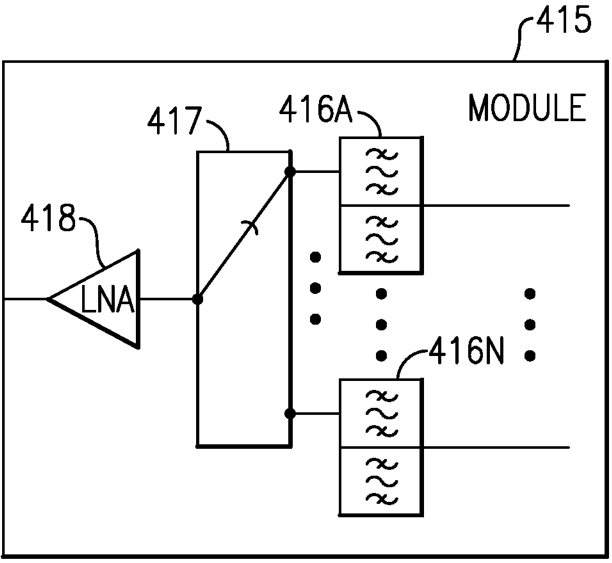
FIG. 13B is a schematic block diagram of a module that includes filters, a radio frequency switch, and a low noise amplifier according to an embodiment.

FIG. 13B is a schematic block diagram of a module 415 that includes filters 416A to 416N, a radio frequency switch 417, and a low noise amplifier 418 according to an embodiment. One or more filters of the filters 416A to 416N can include any suitable number of acoustic wave resonators or packages in accordance with any suitable principles and advantages disclosed herein. Any suitable number of filters 416A to 416N can be implemented. The illustrated filters 416A to 416N are receive filters. In some embodiments (not illustrated), one or more of the filters 416A to 416N can be included in a multiplexer that also includes a transmit filter. The radio frequency switch 417 can be a multi-throw radio frequency switch. The radio frequency switch 417 can electrically couple an output of a selected filter of filters 416A to 416N to the low noise amplifier 418. In some embodiments (not illustrated), a plurality of low noise amplifiers can be implemented. The module 415 can include diversity receive features in certain applications.

Figure 14A:
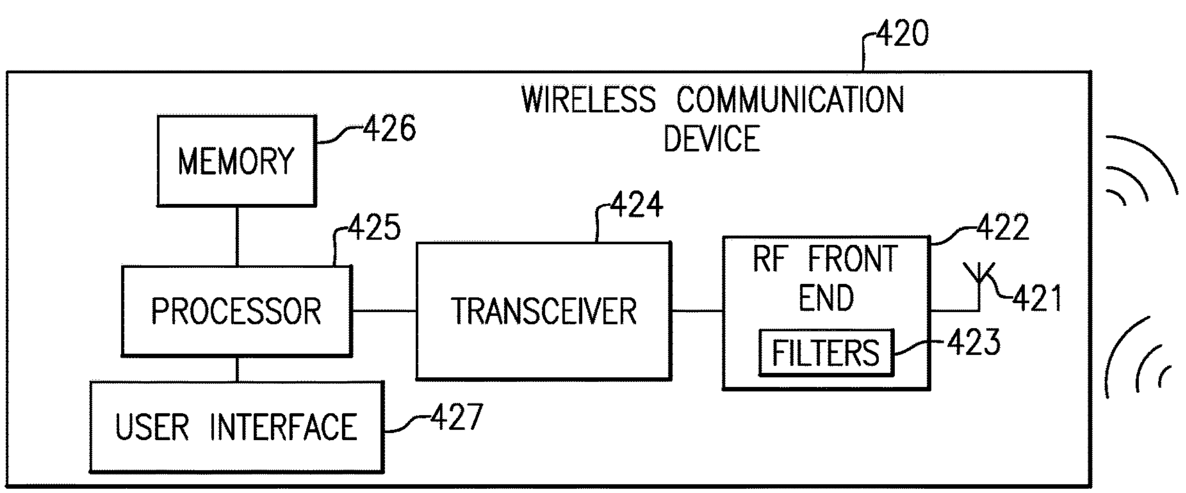
FIG. 14A is a schematic block diagram of a wireless communication device that includes a filter with a surface acoustic wave resonator in accordance with one or more embodiments.

FIG. 14A is a schematic diagram of a wireless communication device 420 that includes filters 423 in a radio frequency front end 422 according to an embodiment. The filters 423 can include one or more SAW resonators or packages in accordance with any suitable principles and advantages discussed herein. The wireless communication device 420 can be any suitable wireless communication device. For instance, a wireless communication device 420 can be a mobile phone, such as a smart phone. As illustrated, the wireless communication device 420 includes an antenna 421, an RF front end 422, a transceiver 424, a processor 425, a memory 426, and a user interface 427. The antenna 421 can transmit/receive RF signals provided by the RF front end 422. Such RF signals can include carrier aggregation signals. Although not illustrated, the wireless communication device 420 can include a microphone and a speaker in certain embodiments.

The RF front end 422 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 422 can transmit and receive RF signals associated with any suitable communication standards. The filters 423 can include SAW resonators of a SAW component or package that includes any suitable combination of features discussed with reference to any embodiments discussed above.

The transceiver 424 can provide RF signals to the RF front end 422 for amplification and/or other processing. The transceiver 424 can also process an RF signal provided by a low noise amplifier of the RF front end 422. The transceiver 424 is in communication with the processor 425. The processor 425 can be a base band processor. The processor 425 can provide any suitable base band processing functions for the wireless communication device 420. The memory 426 can be accessed by the processor 425. The memory 426 can store any suitable data for the wireless communication device 420. The user interface 427 can be any suitable user interface, such as a display with touch screen capabilities.

Figure 14B:
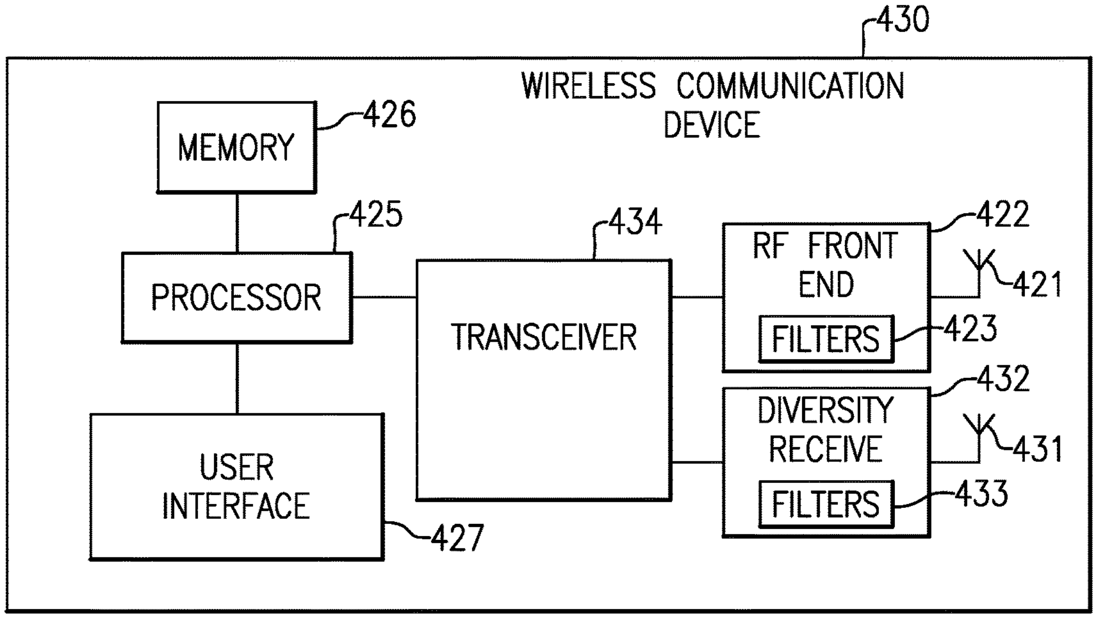
FIG. 14B is a schematic block diagram of another wireless communication device that includes a filter with a surface acoustic wave resonator in accordance with one or more embodiments.

FIG. 14B is a schematic diagram of a wireless communication device 430 that includes filters 423 in a radio frequency front end 422 and second filters 433 in a diversity receive module 432. The wireless communication device 430 is like the wireless communication device 420 of FIG. 14A, except that the wireless communication device 430 also includes diversity receive features. As illustrated in FIG. 14B, the wireless communication device 430 includes a diversity antenna 431, a diversity module 432 configured to process signals received by the diversity antenna 431 and including filters 433, and a transceiver 434 in communication with both the radio frequency front end 422 and the diversity receive module 432. The filters 433 can include one or more SAW resonators or packaged acoustic wave components that include any suitable combination of features discussed with reference to any embodiments discussed above.

Although embodiments disclosed herein relate to surface acoustic wave resonators or packages and packaged acoustic wave components, any suitable principles and advantages disclosed herein can be applied to other types of acoustic wave resonators that include an IDT electrode, such as Lamb wave resonators and/or boundary wave resonators.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz. Acoustic wave resonators and/or filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words “comprise,” “comprising,” “include,” “including,” and the like are to be construed in an inclusive sense, as opposed to an exclusive or exhaustive sense; that is to say, in the sense of “including, but not limited to.” The word “coupled,” as generally used herein, refers to two or more elements that may be either directly connected, or connected by way of one or more intermediate elements. Likewise, the word “connected,” as generally used herein, refers to two or more elements that may be either directly connected, or connected by way of one or more intermediate elements. As used herein, the term “approximately” indicates that the modified characteristic need not be absolute, but is close enough so as to achieve the advantages of the characteristic. Additionally, the words “herein,” “above,” “below,” and words of similar import, when used in this disclosure, shall refer to this disclosure as a whole and not to any particular portions of this disclosure. Where the context permits, words in the above Detailed Description using the singular or plural number may also include the plural or singular number respectively. The word “or” in reference to a list of two or more items covers all of the following interpretations of the word: any of the items in the list, all of the items in the list, and any combination of the items in the list.

Moreover, conditional language used herein, such as, among others, “can,” “could,” “might,” “may,” “e.g.,” “for example,” “such as,” and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Language of degree used herein, such as the terms “approximately,” “about,” “generally,” and “substantially” as used herein represent a value, amount, or characteristic close to the stated value, amount, or characteristic that still performs a desired function or achieves a desired result. For example, the terms “approximately,” “about,” “generally,” and “substantially” may refer to an amount that is within less than 10% of, within less than 5% of, within less than 1% of, within less than 0.1% of, and within less than 0.01% of the stated amount. As another example, in certain embodiments, the terms “generally parallel” and “substantially parallel” refer to a value, amount, or characteristic that departs from exactly parallel by less than or equal to 15 degrees, 10 degrees, 5 degrees, 3 degrees, 1 degree, or 0.1 degree.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A packaged acoustic wave component comprising:
- a substrate;
- a dielectric layer disposed over the substrate;
- a piezoelectric structure disposed over the dielectric layer;
- an electrode structure disposed over the piezoelectric structure;
- a polymer structure including a polymer structure wall portion and a polymer structure roof portion configured to form a cavity over the electrode structure;
- a metal structure disposed over the polymer structure; and
- a buffer coating disposed over the metal structure,
- the polymer structure having a polymer structure lateral portion sandwiched between the substrate, the dielectric layer, or the piezoelectric structure on one side, and the metal structure and the buffer coating on the other side.

2. The packaged acoustic wave component of claim 1 wherein the polymer structure comprises, or consists of, a polyimide material and/or a polybenzoxazole material.

3. The packaged acoustic wave component of claim 1 wherein the metal structure comprises a metal structure wall portion, and the polymer structure lateral portion is arranged in contact with the metal structure wall portion, and the metal structure wall portion surrounds the polymer structure wall portion.

4. The packaged acoustic wave component of claim 1 wherein the buffer coating comprises a buffer coating wall portion, the polymer structure lateral portion is arranged in contact with the buffer coating wall portion.

5. The packaged acoustic wave component of claim 4 wherein an outer lateral edge of the buffer coating wall portion is set back with respect to an outer lateral edge of the substrate.

6. The packaged acoustic wave component of claim 1 wherein an outer lateral edge of the polymer structure lateral portion is set back with respect to an outer lateral edge of the substrate.

7. The packaged acoustic wave component of claim 1 wherein an outer lateral edge of the buffer coating is set back further with respect to an outer lateral edge of the substrate than an outer lateral edge of the polymer structure lateral portion is set back with respect to the outer lateral edge of the substrate.

8. The packaged acoustic wave component of claim 7 wherein the outer lateral edge of the buffer coating is set back with respect to an outer lateral edge of the polymer structure lateral portion.

9. The packaged acoustic wave component of claim 1 wherein the substrate, the dielectric layer and the piezoelectric structure have a same outer lateral edge.

10. The packaged acoustic wave component of claim 1 wherein a gap is arranged between the piezoelectric structure and the polymer structure and between the dielectric layer and the polymer structure.

11. The packaged acoustic wave component of claim 10 wherein in the gap the substrate is open to the cavity.

12. The packaged acoustic wave component of claim 1 wherein the polymer structure lateral portion is sandwiched directly between the piezoelectric structure on one side and the metal structure and the buffer coating on the other side.

13. The packaged acoustic wave component of claim 1 wherein the polymer structure lateral portion is sandwiched directly between the substrate on one side and the metal structure and the buffer coating on the other side.

14. The packaged acoustic wave component of claim 1 wherein the electrode structure comprises at least one interdigital transducer electrode.

15. The packaged acoustic wave component of claim 1 wherein the electrode structure is part of a first metal layer, a second metal layer is formed partially over the first metal layer and in at least two positions partially over the polymer structure lateral portion, and the polymer structure wall portion is formed partially over the second metal layer in the at least two positions, and over the polymer structure lateral portion in positions apart from the at least two positions.

16. The packaged acoustic wave component of claim 15 wherein the metal structure is in electrical contact with the second metal layer at the at least two positions.

17. A radio frequency module comprising the packaged acoustic wave component of claim 1.

18. A wireless communication device comprising the packaged acoustic wave component of claim 1.

19. A method of making a packaged acoustic wave component, comprising:
- forming an acoustic wave device including forming or providing a substrate, forming or providing a piezoelectric structure over at least a portion of the substrate, and forming or providing an electrode structure disposed over the piezoelectric structure;
- providing a polymer structure lateral portion over the substrate or over the piezoelectric structure;
- forming or providing a polymer structure comprising a polymer structure wall portion and a polymer structure roof portion configured to form a cavity over the electrode structure;
- forming or providing a metal structure disposed over the polymer structure; and
- forming a buffer coating disposed over the metal structure,
- the polymer structure having a polymer structure lateral portion sandwiched between the substrate, a dielectric layer disposed on the substrate, or the piezoelectric structure on one side, and the metal structure and the buffer coating on the other side.

20. The method of claim 19 further comprising forming the electrode structure as part of a first metal layer, and forming a second metal layer partially over the first metal layer and in at least two positions partially over the polymer structure lateral portion, the forming or providing of the polymer structure wall portion including forming or providing the polymer structure wall portion partially over the second metal layer in the at least two positions, and over the polymer structure lateral portion in positions apart from the at least two positions.

* * * * *